United States Patent
Umeda et al.

(10) Patent No.: US 8,890,530 B2
(45) Date of Patent: Nov. 18, 2014

(54) MAGNETIC RESONANCE IMAGING METHOD, MAGNETIC RESONANCE IMAGING APPARATUS, AND CONTROL DEVICE OF MAGNETIC RESONANCE IMAGING APPARATUS

(75) Inventors: Masaaki Umeda, Sakura (JP); Mitsukazu Kamata, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 526 days.

(21) Appl. No.: 13/187,824

(22) Filed: Jul. 21, 2011

(65) Prior Publication Data
US 2012/0019251 A1     Jan. 26, 2012

(30) Foreign Application Priority Data

Jul. 23, 2010 (JP) ................................ 2010-166271
Jun. 29, 2011 (JP) ................................ 2011-144834

(51) Int. Cl.
*G01V 3/00* (2006.01)
*G01R 33/565* (2006.01)
*G01R 33/483* (2006.01)
*G01R 33/561* (2006.01)

(52) U.S. Cl.
CPC ...... *G01R 33/56518* (2013.01); *G01R 33/4836* (2013.01); *G01R 33/5617* (2013.01)
USPC .......................................... 324/318; 324/320

(58) Field of Classification Search
USPC .......................... 324/318, 320, 307, 309, 314
See application file for complete search history.

(56) References Cited

U.S. PATENT DOCUMENTS

| | | | | |
|---|---|---|---|---|
| 4,647,858 A * | 3/1987 | Bottomley | ..................... | 324/320 |
| 4,703,275 A * | 10/1987 | Holland | ......................... | 324/318 |
| 7,112,964 B2 * | 9/2006 | Zhou et al. | ..................... | 324/307 |
| 8,487,614 B2 * | 7/2013 | Kamata | ......................... | 324/307 |
| 2009/0212772 A1 | 8/2009 | Ookawa | | |
| 2010/0148774 A1 | 6/2010 | Kamata | | |

FOREIGN PATENT DOCUMENTS

JP      3-195539       8/1991

OTHER PUBLICATIONS

Office Action dated Nov. 27, 2013 in CN 201110205606.5.

* cited by examiner

*Primary Examiner* — Louis Arana
(74) *Attorney, Agent, or Firm* — Nixon & Vanderhye PC

(57) ABSTRACT

According to one embodiment, an MRI apparatus includes a signal acquisition unit, an image generating unit, a position acquiring unit, and a correction unit. The signal acquisition unit acquires a magnetic resonance signal produced from an object by applying a gradient magnetic field and an RF pulse in an imaging space where the object is placed. The image generating unit reconstructs image data on the object based on the magnetic resonance signal. The position acquiring unit acquires an imaging region as positional information in the imaging space. The correction unit brings a distribution of the gradient magnetic field close to a target distribution by transforming a waveform of the gradient magnetic field based on the positional information and a time constant of an eddy-current magnetic field to cancel the eddy-current magnetic field.

14 Claims, 12 Drawing Sheets

| CHANNEL | NUMBER | τ | A1 | A2 | A3 | A4 |
|---|---|---|---|---|---|---|
| XX_X | 1 | 40.0 | 0 | 30.0 | 0 | 0 |
| XX_X | 2 | 3.0 | 0 | 3.2 | 0 | 0 |
| YX_X | 1 | 100.0 | 0 | 2.5 | 0 | 0 |
| ZX_X | 1 | 0 | 0 | 0 | 0 | 0 |
| XY_X | 1 | 50.0 | 0 | 10.0 | 0 | 0 |
| YY_X | 1 | 30.0 | 0 | 5.0 | 0 | 0 |
| YY_X | 2 | 3.0 | 0 | 4.0 | 0 | 0 |
| ZY_X | 1 | 40.0 | 0 | 9.0 | 0 | 0 |
| XZ_X | 1 | 50.0 | 0 | 15.0 | 0 | 0 |
| YZ_X | 1 | 60.0 | 0 | 1.0 | 0 | 0 |
| ZZ_X | 1 | 50.0 | 0 | 29.0 | 0 | 0 |
| ZZ_X | 2 | 3.0 | 0 | 10.0 | 0 | 0 |

AN EXAMPLE OF A PARAMETER VALUE OF
EACH EDDY-CURRENT MAGNETIC FIELD COMPONENT
OF X OFF-CENTER

FIG. 4

| CHANNEL | NUMBER | τ | A1 | A2 | A3 | A4 |
|---|---|---|---|---|---|---|
| XX_Y | 1 | 60.0 | 0 | 20.0 | 0 | 0 |
| XX_Y | 2 | 4.0 | 0 | 4.2 | 0 | 0 |
| YX_Y | 1 | 200.0 | 0 | 1.5 | 0 | 0 |
| ZX_Y | 1 | 0 | 0 | 0 | 0 | 0 |
| XY_Y | 1 | 100.0 | 0 | 21.0 | 0 | 0 |
| YY_Y | 1 | 90.0 | 0 | 5.1 | 0 | 0 |
| YY_Y | 2 | 180.0 | 0 | 4.2 | 0 | 0 |
| ZY_Y | 1 | 60.0 | 0 | 7.0 | 0 | 0 |
| XZ_Y | 1 | 70.0 | 0 | 3.5 | 0 | 0 |
| YZ_Y | 1 | 10.0 | 0 | 9.0 | 0 | 0 |
| ZZ_Y | 1 | 20.0 | 0 | 25.0 | 0 | 0 |
| ZZ_Y | 2 | 3.0 | 0 | 8.0 | 0 | 0 |

AN EXAMPLE OF A PARAMETER VALUE OF
EACH EDDY-CURRENT MAGNETIC FIELD COMPONENT
OF Y OFF-CENTER

FIG. 5

| CHANNEL | NUMBER | τ | A1 | A2 | A3 | A4 |
|---|---|---|---|---|---|---|
| XX_Z | 1 | 20.0 | 0 | 10.0 | 0 | 0 |
| XX_Z | 2 | 1.0 | 0 | 1.2 | 0 | 0 |
| YX_Z | 1 | 40.0 | 0 | 1.5 | 0 | 0 |
| ZX_Z | 1 | 0 | 0 | 0 | 0 | 0 |
| XY_Z | 1 | 3.0 | 0 | 1.1 | 0 | 0 |
| YY_Z | 1 | 10.0 | 0 | 5.1 | 0 | 0 |
| YY_Z | 2 | 20.0 | 0 | 4.2 | 0 | 0 |
| ZY_Z | 1 | 60.0 | 0 | 7.0 | 0 | 0 |
| XZ_Z | 1 | 50.0 | 0 | 7.2 | 0 | 0 |
| YZ_Z | 1 | 5.0 | 0 | 1.6 | 0 | 0 |
| ZZ_Z | 1 | 22.0 | 0 | 12.1 | 0 | 0 |
| ZZ_Z | 2 | 2.0 | 0 | 1.0 | 0 | 0 |

AN EXAMPLE OF A PARAMETER VALUE OF
EACH EDDY-CURRENT MAGNETIC FIELD COMPONENT
OF Z OFF-CENTER

FIG. 6

MAGNETIC RESONANCE IMAGING METHOD, MAGNETIC RESONANCE IMAGING APPARATUS, AND CONTROL DEVICE OF MAGNETIC RESONANCE IMAGING APPARATUS

CROSS-REFERENCE TO RELATED APPLICATION(S)

This application is based upon and claims the benefit of priority from Japanese Patent Application No. 2010-166271, filed on Jul. 23, 2010 and Japanese Patent Application No. 2011-144834 filed on Jun. 29, 2011;

The entire contents of which are incorporated herein by reference.

BACKGROUND OF THE INVENTION

1. Field of the Invention

Embodiments described herein relate generally to a magnetic resonance imaging method, a magnetic resonance imaging apparatus, and a control device of a magnetic resonance imaging apparatus.

2. Description of the Related Art

MRI is an imaging method which magnetically excites nuclear spin of an object (a patient) set in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

A known cause of image quality degradation of MRI is distortion of a gradient magnetic field distribution. Ideally, the gradient magnetic field is distributed in the slice selection direction, the phase encoding direction and the frequency encoding direction in such a manner that the magnetic field intensity linearly varies with the position in the direction of application, for example. In actuality, however, a pulse current supplied to a gradient magnetic field coil causes an eddy current. The eddy current induces a magnetic field, and the magnetic field is added to the gradient magnetic field to cause distortion of the gradient magnetic field distribution.

To correct the input gradient magnetic field waveform, a typical eddy-current compensation is designed to compensate for only the primary component of the magnetic field induced by the eddy current, which spatially linearly varies. Therefore, the eddy-current compensation cannot compensate for the secondary and higher-order components of the magnetic field induced by the eddy current. To solve the problem, there is a technique of compensating for the secondary and higher-order components of the magnetic field induced by the eddy current by applying a current to higher-order shim coils.

In addition, Japanese Patent Laid-Open No. 3-195539 discloses an arrangement that compensates for a magnetic field induced by an eddy current by selecting one or more of a plurality of current compensation circuits previously provided.

In general, the distortion of the gradient magnetic field distribution becomes more significant as the distance from the center of the magnetic field increases. Accordingly, the conventional technique that compensates for only the primary component of the magnetic field induced by the eddy current cannot prevent image quality degradation due to the distortion of the magnetic field distribution caused by the secondary and higher-order components of the magnetic field induced by the eddy current, in particular when the imaging region is located off-center. The term off-center means at a position away from the center of the magnetic field.

The conventional technique that uses higher-order shim coils to compensate for the secondary and higher-order components of the magnetic field induced by the eddy current has a disadvantage that a waiting time of several seconds is needed to avoid coupling with other coils or other effects, for example. Furthermore, in some cases, channels for the higher-order shim components may not correspond to channels for the higher-order components of the magnetic field induced by the eddy current. For example, even if the shim coils include coils for compensating for the secondary components, such as XZ and YY, the magnetic field induced by the eddy current cannot be sufficiently compensated for if the magnetic field induced by the eddy current has a significant third-order or fourth-order component.

BRIEF DESCRIPTION OF THE DRAWINGS

In the accompanying drawings:

FIG. 4 is a table showing an example of values of the parameters of each eddy-current magnetic field component at an X off-center position;

FIG. 5 is a table showing an example of values of the parameters of each eddy-current magnetic field component at a Y off-center position;

FIG. 6 is a table showing an example of values of the parameters of each eddy-current magnetic field component at a Z off-center position;

DETAILED DESCRIPTION

One embodiment of the present invention aims at providing a technique, distinct from the prior art, of improving image quality by compensating for a magnetic field component induced by an eddy current in MRI in a simple manner. But the present invention is not limited to this aim.

According to one embodiment, a magnetic resonance imaging apparatus includes a signal acquisition unit, an image generating unit, a position acquiring unit, and a correction unit.

The signal acquisition unit acquires a magnetic resonance signal produced from an object by applying a gradient magnetic field and an RF pulse in an imaging space where the object is placed.

The image generating unit reconstructs image data on the object based on the magnetic resonance signal.

The position acquiring unit acquires an imaging region as positional information in the imaging space.

The correction unit brings a distribution of the gradient magnetic field close to a target distribution by transforming a waveform of the gradient magnetic field based on the positional information and a time constant of an eddy-current magnetic field to cancel the eddy-current magnetic field, the eddy-current magnetic field being induced by an eddy current caused by application of the gradient magnetic field.

According to one embodiment, a control device is a control device in a magnetic resonance imaging apparatus which supplies a current to a gradient magnetic field coil to apply a gradient magnetic field to an imaging space where an object is placed and performs magnetic resonance imaging of the object by using the gradient magnetic field. The control device includes the aforementioned position acquiring unit and the aforementioned correction unit.

According to one embodiment, a magnetic resonance imaging method includes the steps of:

(a) acquiring an imaging region as positional information in an imaging space where an object is placed;

(b) bringing, as a correction step, a distribution of a gradient magnetic field close to a target distribution by transforming a waveform of the gradient magnetic field based on the positional information and a time constant of an eddy-current magnetic field to cancel the eddy-current magnetic field, the eddy-current magnetic field being induced by an eddy current caused by application of the gradient magnetic field;

(c) acquiring a magnetic resonance signal produced from the object by applying the gradient magnetic field transformed in the correction step and an RF pulse in the imaging space; and (d) reconstructing image data on the object based on the magnetic resonance signal.

A magnetic resonance imaging apparatus and its control device and a magnetic resonance imaging method according to embodiments of the present invention will be described with reference to the accompanying drawings.

Note that the same reference numbers are given for identical components in each figure, and overlapping explanation is abbreviated.

(Configuration of the MRI Apparatus)

Figure 1:
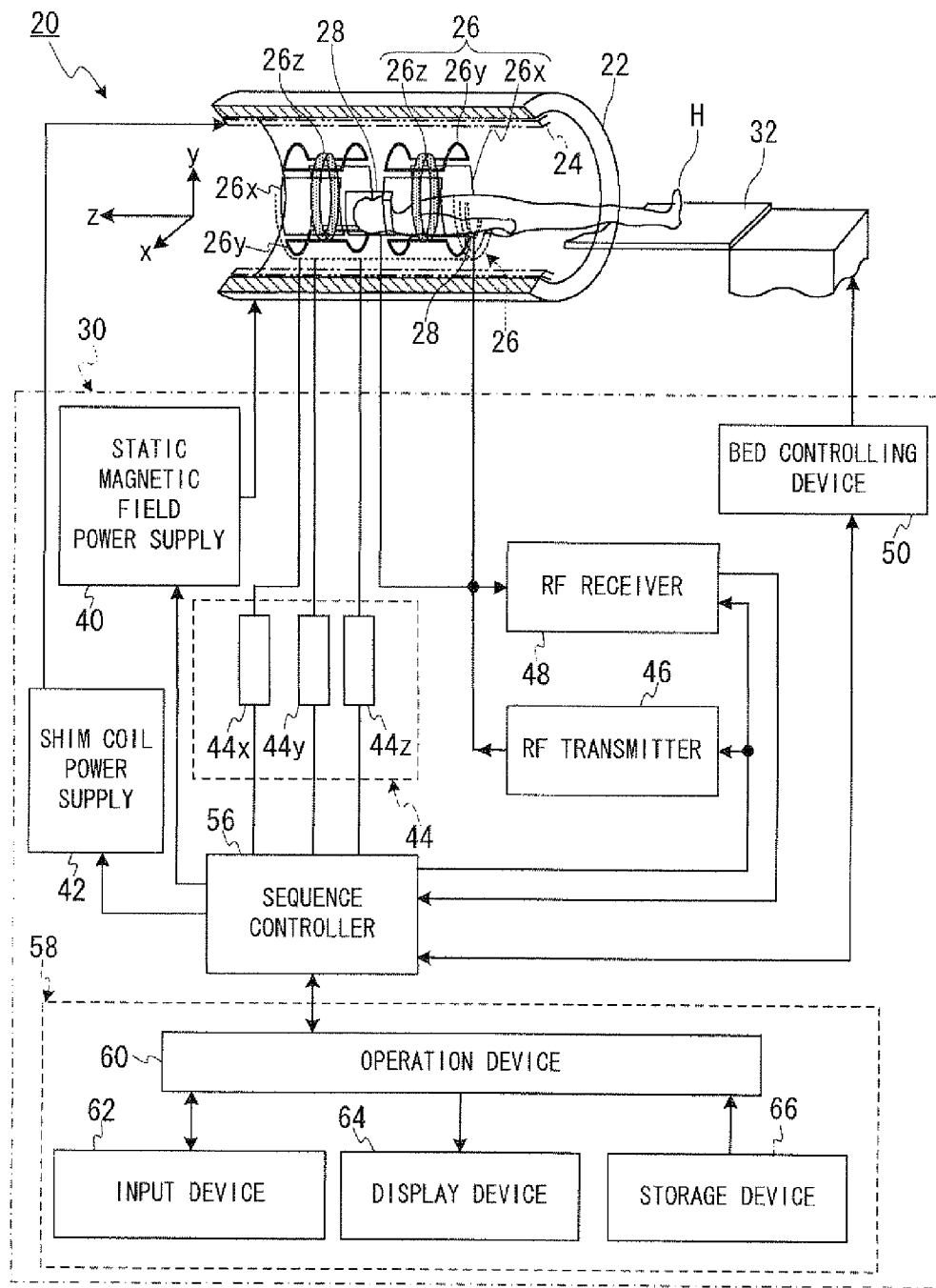
FIG. 1 is a block diagram showing general structure of the MRI apparatus of the present embodiment.

FIG. 1 is a block diagram showing general structure of the MRI apparatus 20 according to an embodiment of the present invention.

The MRI apparatus 20 includes a cylinder-shaped static magnetic field magnet 22 for generating a static magnetic field, a cylinder-shaped shim coil 24 coaxially-arranged inside the static magnetic field magnet 22, a gradient coil 26 (i.e. gradient magnetic field coil 26), RF coils 28, a control device 30, and a bed 32 for placing an object (e.g. a patient) P on it.

Here, as one example, an X axis, a Y axis and a Z axis of an apparatus coordinate system (a device coordinate system) are defined as follows.

Firstly, The X axis, the Y axis and the Z axis are perpendicular to each other.

Secondly, the direction of an axis of the static magnetic field magnet 22 and the shim coil 24 is aligned with the direction which is perpendicular to the vertical direction, and the direction of the axis of the static magnetic field magnet 22 and the shim coil 24 is defined as the Z axis direction.

Thirdly, it is assumed that the vertical direction is the same as the Y axis direction.

Fourthly, the bed 32 is disposed in such a position that the direction of "the normal line of the table plane thereof on which an object is put" is the same as the Y axis direction.

The control device 30 includes, for example, a static magnetic field power supply 40, a shim coil power supply 42, a gradient magnetic field power supply 44, an RF transmitter 46, an RF receiver 48, a bed controlling device 50, a sequence controller 56 and a computer 58.

The gradient magnetic field power supply 44 includes an X-axis gradient magnetic field power supply 44$x$, a Y-axis gradient magnetic field power supply 44$y$ and a Z-axis gradient magnetic field power supply 44$z$.

The computer 58 includes an operation device 60, an input device 62, a display device 64 and a storage device 66.

The static magnetic field magnet 22 is electrically connected to the static magnetic field power supply 40 and generates a static magnetic field in an imaging space by using electric current supplied from the static magnetic field power supply 40.

The term imaging space described above refers to a space in a gantry in which an object H is placed and to which a static magnetic field is applied. The term gantry refers to a structure having a cylindrical shape, for example, which includes a static magnetic field magnet 22, a shim coil 24, a gradient magnetic field coil 26, and RF coils 28. The gantry and a bed 32 are configured so that the bed 32 on which the object H is placed can move to the inside of the gantry. For simplicity, FIG. 1 does not show the gantry itself but shows the static magnetic field magnet 22, the shim coil 24, the gradient magnetic field coil 26 and the RF coils 28 in the gantry as components of the gantry.

The imaging region means a region set as a part of the imaging space and is a range of acquisition of MR signals used to generate one image or one set of images. The one image or one set of images may be a two-dimensional image or a three-dimensional image. Here, one set of images means, for example, a plurality of images when MR signals of the plurality of images are acquired in a lump in one pulse sequence such as multi-slice imaging. The imaging region is defined three-dimensionally in an apparatus coordinate system, for example. In this specification, as an example, the imaging region will be referred to as an imaging slice if the imaging region is a thin region or as an imaging slab if the imaging region has a certain thickness.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging region.

That is, directions of a gradient magnetic field Gss in a slice selection direction, a gradient magnetic field Gpe in a phase encoding direction and a gradient magnetic field Gro in a readout (frequency encoding) direction can be arbitrarily set as logical axes, by combining gradient magnetic fields Gx, Gy and Gz in the X-axis, Y-axis and Z-axis directions as three physical axes.

The gradient magnetic fields Gss, Gpe and Gro in the slice selection direction, the phase encoding direction and the readout direction are superimposed on the static magnetic field.

The RF transmitter 46 generates RF pulses in accordance with control information provided from the sequence controller 56, and outputs the generated RF pulses to the transmission RF coil 28.

The RF coils 28 include a WBC (whole body coil) built in the gantry for transmission and reception of RF pulses and local coils arranged around the bed 32 or the object H for reception of RF pulses.

The transmission RF coil 28 transmits an RF pulse given from the RF transmitter 46 to the object H. The reception RF coil 28 receives an MR signal generated due to excited nuclear spin inside the object H by the RF pulse and this MR signal is detected by the RF receiver 48.

The RF receiver 48 generates raw data which are digitized complex number data obtained by performing A/D (analogue to digital) conversion after performing predetermined signal processing such as preamplification, intermediate-frequency conversion, phase detection, low-frequency amplification and filtering to the detected MR signal. The RF receiver 48 inputs the generated raw data to the sequence controller 56.

The operation device 60 performs system control of the MRI apparatus 20 in imaging operation.

The sequence controller 56 storages control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 56 generates the gradient magnetic fields Gx, Gy and Gz in the X-axis, Y-axis and Z-axis directions and RF pulses by driving the gradient magnetic field power supply 44, the RF transmitter 46 and the RF receiver 48 according to a predetermined sequence stored. Additionally, the sequence controller 56 receives raw data of an MR signal inputted from the RF receiver 48, and input the raw data to the operation device 60.

The bed controlling device 50 is connected to an operation device 60 via a sequence controller 56. The sequence controller 56 controls the bed controlling device 50 under instructions from the operation device 60 to move a top board of the bed 32.

Figure 2:
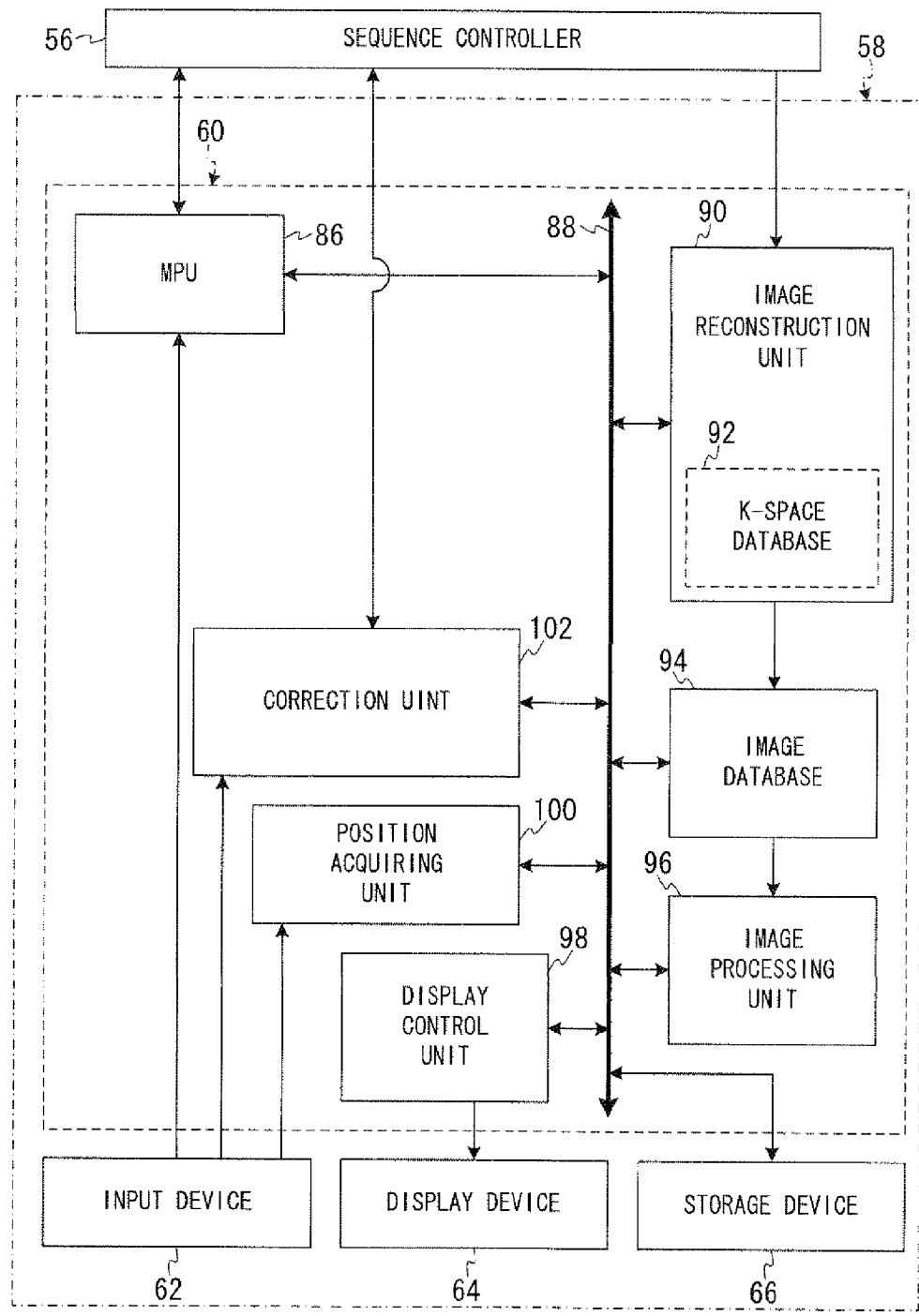
FIG. 2 is a functional block diagram of the computer 58 shown in FIG. 1.

FIG. 2 is a functional block diagram of the computer 58 shown in FIG. 1.

The operation device 60 of the computer 58 includes an MPU (Micro Processor Unit) 86, a system bus 88, an image reconstruction unit 90, an image database 94, an image processing unit 96, an display controlling unit 98, a position acquiring unit 100, and a correction unit 102.

The MPU 86 performs system control of the MRI apparatus 20 in setting of imaging conditions, imaging operation and image display after imaging through interconnection such as the system bus 88.

Additionally, the MPU 86 functions as imaging conditions setting unit, sets imaging conditions including a pulse sequence based on command information from the input device 62, and inputs the set imaging conditions into the sequence controller 56. In order to achieve it, the MPU 86 controls the display controlling unit 98 and displays information for setting imaging conditions on the display device 64.

The input device 62 provides a user with a function to set imaging conditions and image processing conditions.

The image reconstruction unit 90 includes a k-space database 92 inside. The image reconstruction unit 90 arranges "raw data of MR signals inputted from the sequence controller 56" in the k-space formed in the k-space database 92 as k-space data. The image reconstruction unit 90 generates image data of each slice of the object H by performing image reconstruction processing including such as 2-dimensional Fourier transformation. The image reconstruction unit 90 stores the generated image data in the image database 94.

The image processing unit 96 takes in the image data from the image database 94, performs predetermined image processing on them, and stores the image data after the image processing in the storage device 66 as image data for display.

The storage device 66 stores the image data for display after adding accompanying information such as imaging conditions used for generating the image data for display and information of the object H (patient information) to the image data for display.

The display controlling unit 98 displays a screen for setting imaging conditions and an image indicated by generated image data through imaging on the display device 64 under control of the MPU 86.

A position acquiring unit 100 acquires the imaging region as positional information based on the apparatus coordinate system in the imaging space, and inputs the imaging region to a correction unit 102.

The correction unit 102 calculates the magnitude of a magnetic field induced by an eddy current caused by a pulse current supplied to the gradient magnetic field coil 26.

In the following, a method of calculating the magnitude of the magnetic field induced by the eddy current will be described. First, as an example, it is assumed that the center of the magnetic field is located at the origin of the apparatus coordinate system. The expression "X off-center" will be used to refer to a position away from the center of the magnetic field in an X-axis direction. Similarly, the expressions "Y off-center" and "Z off-center" will be used to refer to positions away from the center of the magnetic field in a Y-axis direction and a Z-axis direction, respectively.

Figure 3:
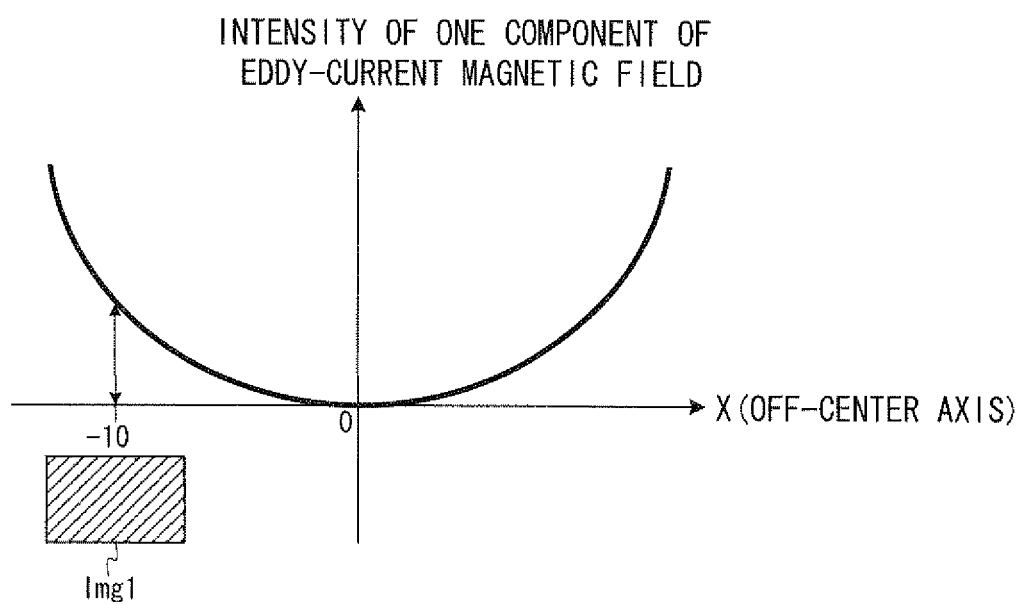
FIG. 3 is an example of intensity distribution of a component of the magnetic field induced by the eddy current in the X-axis direction in a region 5-cm away from the center of the magnetic field in the positive direction along the Y axis.

FIG. 3 shows an example of intensity distribution of a component of the magnetic field induced by the eddy current in the X-axis direction in a region 5-cm away from the center of the magnetic field in the positive direction along the Y axis. The abscissa axis in FIG. 3 is an off-center axis, which indicates the eddy current magnetic field as a function of position in the X-axis direction. The longitudinal axis in FIG. 3 is an observation axis, which indicates the magnetic field intensity with a time constant τ of a secondary component of a Y component of the magnetic field induced by the eddy current. In a region 5-cm away from the center of the magnetic field in the negative direction along the Y-axis, the distribution of the magnetic field intensity of the same magnetic field component in the X-axis direction is the distribution shown in FIG. 3 reversed in the longitudinal-axis direction.

As shown in the above example, any component of the intensity of the magnetic field induced by the eddy current generally increases as the distance from the center of the magnetic field increases, and the degree of the effect of the magnetic field induced by the eddy current varies with the position of the imaging region. Thus, the correction unit 102 calculates correction values for the current supplied to each of X-axis, Y-axis and Z-axis gradient coils 26x, 26y and 26z based on the magnitude of the magnetic field induced by the eddy current and the position of the imaging region, so as to achieve target distributions (desired distributions) of gradient magnetic fields Gss, Gpe and Gro. The components of the magnetic field induced by the eddy current are defined as described below.

The X component, the Y component, and the Z component of the magnetic field induced by the eddy current when an X-axis gradient magnetic field Gx as applied at an X off-center position are expressed as XX_X, XY_X, and XZ_X, respectively.

The X component, the Y component, and the Z component of the magnetic field induced by the eddy current when a Y-axis gradient magnetic field Gy as applied at an X off-center position are expressed as YX_X, YY_X, and YZ_X, respectively.

The X component, the Y component, and the Z component of the magnetic field induced by the eddy current when a Z-axis gradient magnetic field Gz as applied at an X off-center position are expressed as ZX_X, ZY_X, and ZZ_X, respectively.

The X component, the Y component, and the Z component of the magnetic field induced by the eddy current when an X-axis gradient magnetic field Gx as applied at a Y off-center position are expressed as XX_Y, XY_Y, and XZ_Y, respectively.

The X component, the Y component, and the Z component of the magnetic field induced by the eddy current when a Y-axis gradient magnetic field Gy as applied at a Y off-center position are expressed as YX_Y, YY_Y, and YZ_Y, respectively.

The X component, the Y component, and the Z component of the magnetic field induced by the eddy current when a Z-axis gradient magnetic field Gz as applied at a Y off-center position are expressed as ZX_Y, ZY_Y, and ZZ_Y, respectively.

The X component, the Y component, and the Z component of the magnetic field induced by the eddy current when an X-axis gradient magnetic field Gx is applied at a Z off-center position are expressed as XX_Z, XY_Z, and XZ_Z, respectively.

The X component, the Y component, and the Z component of the magnetic field induced by the eddy current when a Y-axis gradient magnetic field Gy is applied at a Z off-center position are expressed as YX_Z, YY_Z, and YZ_Z, respectively.

The X component, the Y component, and the Z component of the magnetic field induced by the eddy current when a Z-axis gradient magnetic field Gz is applied at a Z off-center position are expressed as ZX_Z, ZY_Z, and ZZ_Z, respectively.

In summary, the leading one of the four characters including the underline of each code indicates which of the gradient magnetic fields Gx, Gy, and Gz is applied. The second character of each code indicates which of the X component, the Y component, and the Z component of the magnetic field induced by the eddy current is involved (as the observation axis). The last character of each code indicates either of X off-center, Y off-center, and Z off-center.

In the following, each component of the magnetic field induced by the eddy current will be referred to as an eddy-current magnetic field component and expressed as an eddy-current magnetic field component XX_X and so on. The eddy-current magnetic field components are given as a product of the amplitude and an attenuation term that exponentially attenuates according to the time constant τ, but may have different time constants. Thus, the amplitudes of the 27 eddy-current magnetic field components are calculated separately for each time constant.

The time constant τ of the eddy-current magnetic field component depends on the time constant of the eddy current and is determined by the following factors, for example. A first factor is the relative positional relationship between the X-axis, Y-axis, and Z-axis gradient coils 26x, 26y, and 26z and the static magnetic field magnet 22. A second factor is the shape, the material and the like of the gradient magnetic field coil 26. The time constant τ can be calculated by measuring the eddy-current magnetic field components during installation adjustment of an MRI apparatus 20, for example, and the calculation data can be stored in the correction unit 102 in the form of table data, for example. Alternatively, the time constant τ of the eddy-current magnetic field component may be calculated by simulation based on the relative positional relationship between the gradient magnetic field coil 26 and the static magnetic field magnet 22 or the shape, the material and the like of the gradient magnetic field coil 26, and the calculation result may be stored in the correction unit 102.

Next, a method of calculating the amplitude of the 27 eddy-current magnetic field component for each time constant will be described.

First, for those of the 27 eddy-current magnetic field components, whose off-center axis and observation axis agree with each other (that is, those components the last character and the second character of the code of which agree with each other), the amplitude is calculated according to the following formula, for example. More specifically, for the 9 eddy-current magnetic field components XX_X, YX_X, ZX_X, XY_Y, YY_Y, ZY_Y, XZ_Z, YZ_Z, and ZZ_Z, the amplitude L is calculated according to the following formula (1).

$$L = A1 + A2 \times \{pol(p)\} \times |p| + A3 \times |p|^2 + A4 \times \{pol(p)\} \times |p|^3 \quad (1)$$

In the formula (1), |p| represents the absolute value of p, and pol(p) represents the polarity of p, positive or negative, and thus, +1 or −1 is substituted for pol(p) depending on the polarity of p.

Second, for those of the 27 eddy-current magnetic field components whose off-center axis and observation axis differ from each other, the amplitude is calculated according to the following formula (2), for example. More specifically, for the 18 eddy-current magnetic field components XY_X, XZ_X, YY_X, YZ_X, ZY_X, ZZ_X, XX_Y, XZ_Y, YX_Y, ZX_Y, ZZ_Y, XX_Z, XY_Z, YX_Z, YY_Z, ZX_Z, and ZY_Z, the amplitude L is calculated according to the following formula (2).

$$L = A1 \times p + A2 \times p^2 + A3 \times p^3 + A4 \times p^4 \qquad (2)$$

Parameters A1, A2, A3, and A4 in the formulas (1) and (2) vary with the eddy-current magnetic field component. The parameters A1 to A4 can be acquired by measuring each eddy-current magnetic field component during installation adjustment of the MRI apparatus 20, for example, and the acquired data can be inputted to and configured and stored in the correction unit 102 in the form of look-up table (table data), for example.

FIG. 4 is a table showing an example of values of the parameters of each eddy-current magnetic field component at an X off-center position.

FIG. 5 is a table showing an example of values of the parameters of each eddy-current magnetic field component at a Y off-center position.

FIG. 6 is a table showing an example of values of the parameters of each eddy-current magnetic field component at a Z off-center position.

The unit of the time constant τ in FIGS. 4 to 6 is millisecond. As described above, the 27 eddy-current magnetic field components may be further separated into a plurality of terms depending on the time constant. In the example shown in FIG. 4, the eddy-current magnetic field components XX_X, YY_X, and ZZ_X are further separated into a plurality of terms. Although the parameters A1, A3, and A4 are 0 in FIGS. 4 to 6, this is only an example intended for simplicity of explanation. In actuality, the parameters can assume appropriate values based on measurements or the like.

In this embodiment, the formulas (1) and (2) and data represented as a polynomial model preliminarily stored shown in FIGS. 4 to 6 are used to correct the primary, and the secondary and higher-order components of the magnetic field induced by the eddy current at the X off-center position, the Y off-center position, and the Z off-center position, thereby bringing the gradient magnetic field distribution close to the target distribution.

Specifically, the coordinate position of the center of the imaging region (as an imaging slice or an imaging slab) in the imaging space is defined as (x1, y1, z1) according to the apparatus coordinate system. In this case, the X off-center components (those of the 27 eddy-current magnetic field components, whose last character in the code is X) are calculated with respect to the X coordinate value x1. Similarly, the Y off-center components are calculated with respect to the Y coordinate value y1, and the Z off-center components are calculated with respect to the Z coordinate value z1. In this way, the amplitude is calculated for the term of each time constant of all of the 27 eddy-current magnetic field components. As an example, calculation of the amplitude of each eddy-current magnetic field component will be specifically described on the assumption that the coordinates of the center of the imaging slice based on the apparatus coordinate system are (−10, 5, 2).

As to the eddy-current magnetic field component XX_X, the observation axis and the off-center axis agree with each other (because the second character and the last character of the code agree with each other), it is calculated according to the formula (1) using the values of the parameters shown in FIG. 4. Since the eddy-current magnetic field component XX_X is an X off-center component (as shown by the last character of the code), the X coordinate value −10 is used as the value of p in the formula (1). Then, the amplitude $L_{XX\_X1}$ of the first term (which corresponds to a time constant τ of 40 milliseconds) of the eddy-current magnetic field component XX_X is calculated according to the following formula (3).

$$\begin{aligned} L_{XX\_X1} &= A1 + A2 \times \{pol(p)\} \times |p| + A3 \times |p|^2 + \\ & \quad A4 \times \{pol(p)\} \times |p|^3 \\ &= 0 + 30 \times |-10| + 0 \times |-10|^2 + 0 \times (-1) \times |-10|^3 \\ &= -300 \end{aligned} \qquad (3)$$

That is, the first term of the X component of the magnetic field induced by the eddy current when the gradient magnetic field Gx in the X-axis direction is applied at an X off-center position whose X coordinate value is −10 is approximately expressed by the following formula (4) on the assumption that the time of start of application of the gradient magnetic field Gx is a time t=0.

$$L_{XX\_X1} \times \{\exp(-t/\tau)\} = -300 \times \{\exp(-t/0.04)\} \qquad (4)$$

The unit of the magnetic field intensity given by the formula (4) is Tesla, for example. Similarly, the amplitude $L_{XX\_X2}$ of the second term of the eddy-current magnetic field component X_XX (which corresponds to a time constant τ of 3 milliseconds) is calculated according to the following formula (5).

$$\begin{aligned} L_{XX\_X2} &= A1 + A2 \times \{pol(p)\} \times |p| + A3 \times |p|^2 + \\ & \quad A4 \times \{pol(p)\} \times |p|^3 \\ &= -32 \end{aligned} \qquad (5)$$

As to the eddy current-induced magnetic field component YX_Z, the off-center axis and the observation axis differ from each other, it is calculated according to the formula (2) using the values of the parameters shown in FIG. 6. Since the eddy-current magnetic field component YX_Z is a Z off-center component, the Z coordinate value 2 is used as the value of p in the formula (2). In the example shown in FIG. 6, the eddy-current magnetic field component YX_Z includes only the term corresponding to the time constant τ of 40 milliseconds, and therefore, the amplitude $L_{YX\_Z}$ of the eddy-current magnetic field component YX_Z is calculated according to the following formula (6).

$$\begin{aligned} L_{YX\_Z} &= A1 \times p + A2 \times p^2 + A3 \times p^2 + A4 \times p^4 \\ &= 0 \times 2 + 1.5 \times 2^2 + 0 \times 2^3 + 0 \times 2^4 \\ &= 6 \end{aligned} \qquad (6)$$

In this way, the amplitude of all of the 27 eddy-current magnetic field components can be calculated for each time constant by using the formulas (1) and (2) and table data, such as that shown in FIGS. 4 to 6. Thus, a time variation of the distribution of the magnetic field induced by the eddy current can be calculated.

The gradient magnetic field distribution can be corrected by modifying the temporal waveform of the gradient magnetic field by correcting the current supplied to the gradient magnetic field coil 26 so as to cancel all the eddy-current magnetic field components. For example, the values of currents supplied to the X-axis, Y-axis, and Z-axis gradient coils 26x, 26y, and 26z to achieve the target (desired) gradient magnetic field distribution without consideration of the eddy current are calculated as provisional values. Then, the values of currents supplied to the gradient coils 26x, 26y, and 26z to achieve a magnetic field distribution that is the distribution of the eddy-current magnetic field components reversed in sign are calculated as adjustment values. Then, the final values of the currents supplied to the gradient coils 26x, 26y, and 26z can be determined by summing the provisional values and the adjustment values.

Alternatively, the values of the currents supplied to the gradient coils 26x, 26y, 26z may be corrected so as to achieve a gradient magnetic field distribution obtained by subtracting all the eddy-current magnetic field components from the target gradient magnetic field distribution.

The eddy-current magnetic field component attenuates according to the time constant as shown by the formula (4). Thus, to consider the time constant in the correction, the adjustment values for the values of the currents supplied to the gradient magnetic field coil 26 are varied depending on the time elapsed from the time of start of application of the respective gradient magnetic field pulses (which corresponds to a time t1 in FIG. 7 described later).

The gradient magnetic field pulses include slice selection pulses 200 and 202, a phase encoding pulse 204, and read-out pulses 206 and 208, for example, in the case of a pulse sequence for multi-slice imaging shown in FIG. 10 described later. In general, the gradient magnetic field pulse is temporally discrete on the logical axes in a slice selection direction, a phase encoding direction, and a read-out direction.

For example, consider the above-described correction that involves determining the final values of the currents supplied to the gradient coils 26x, 26y, and 26z by summing the provisional values and the adjustment values. In this case, since the adjustment values are the values of the currents supplied to the gradient magnetic field coil 26 to achieve a magnetic field, distribution that is the distribution of the eddy-current magnetic field components reversed in sign, the adjustment values attenuate with time according to the time constant. This is because when the eddy-current magnetic field components attenuate according to the time constant, the absolute values of the adjustment values, which are correction components of the values of the currents supplied to the gradient magnetic field coil 26, should decrease with time. That is, the correction is performed in such a manner that the adjustment values, which correspond to correction amounts, decrease with time after the start of application of the respective gradient magnetic field pulses.

As described above, in the correction that involves transforming the waveform of the gradient magnetic field, a gradient magnetic field distribution is obtained by subtracting the eddy-current magnetic field components from the target gradient magnetic field distribution, if the eddy current is not considered. In actuality, however, the eddy-current magnetic field components are superposed to cancel all the eddy-current magnetic field components previously subtracted. Thus, the target (desired) gradient magnetic field distribution is substantially obtained.

Figure 7:
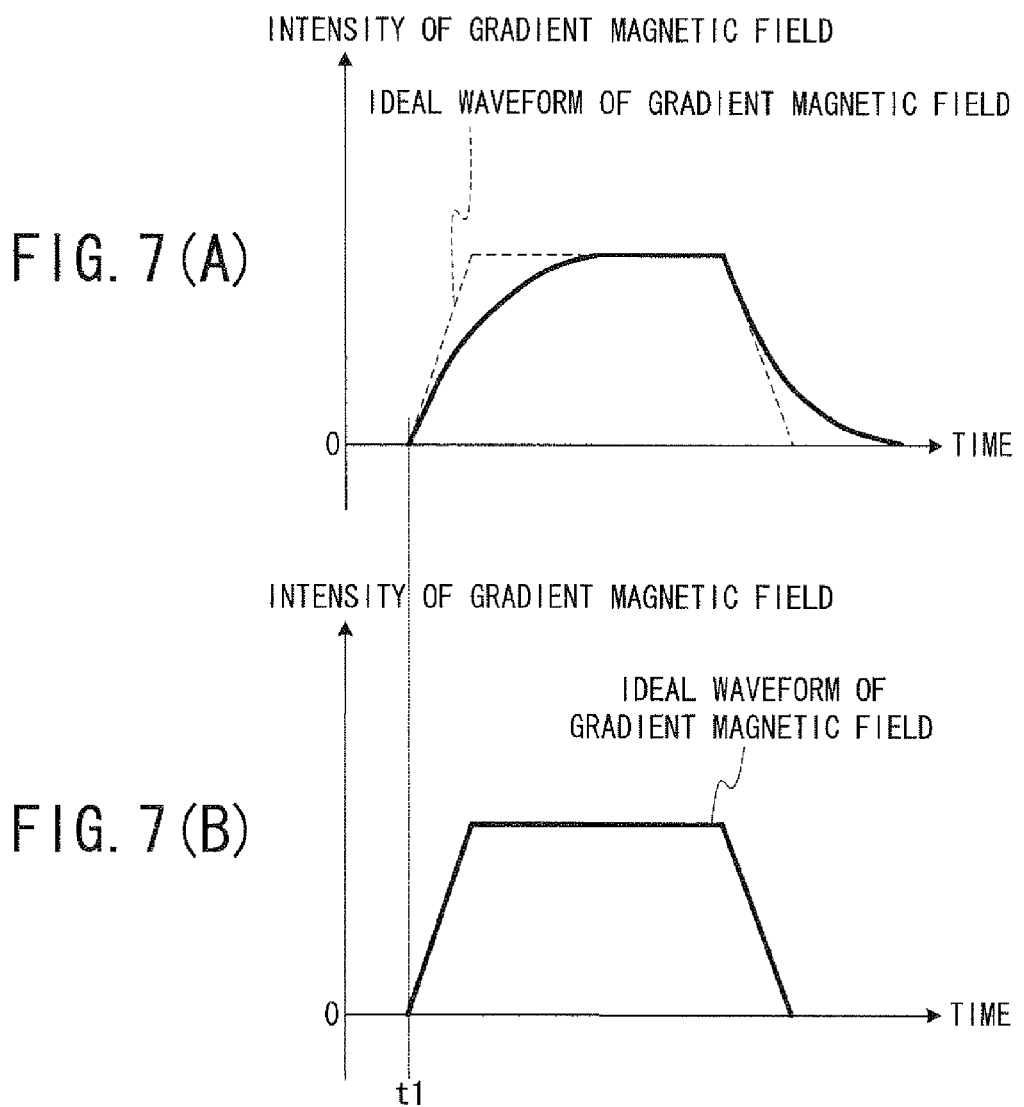
FIGS. 7A and 7B include two schematic diagrams showing an example of a waveform of the gradient magnetic field under the influence of the eddy current and an example of an ideal waveform of the gradient magnetic field corresponding to that waveform.

FIG. 7 includes two schematic diagrams showing an example of a waveform of the gradient magnetic field under the influence of the eddy current and an example of an ideal waveform of the gradient magnetic field corresponding to that waveform. In. FIG. 7(A), the thick line indicates an example of a waveform of the gradient magnetic field under the influence of the eddy current, and the dotted line indicates an ideal waveform of the gradient magnetic field corresponding to the waveform. In FIG. 7(B), the thick line indicates an ideal waveform of the gradient magnetic field, which is the same as the waveform indicted by the dotted line in FIG. 7(A). In FIGS. 7(A) and 7(B), the longitudinal axis indicates the intensity of the gradient magnetic field, and the abscissa axis indicates the elapsed time t.

In FIGS. 7(A)-7(B), it is assumed that a time t1 is the time of start of application of the gradient magnetic field pulse (which substantially coincides with the time of start of supply of the current to the gradient magnetic field coil 26). If compensation for an eddy-current magnetic field is not performed, the waveform of the gradient magnetic field includes curved (rounded) parts, as shown in FIG. 7(A). This is because an eddy-current magnetic field occurs in synchronization with the start of supply of the current to the gradient magnetic field coil 26, and the eddy-current magnetic field is superposed on the gradient magnetic field. However, the eddy-current magnetic field attenuates with time according to the time constant $\tau$. As a result, the eddy-current magnetic field is substantially eliminated in the latter half of the flat part of the waveform of the gradient magnetic field under the influence of the eddy current, and therefore, the waveform of the gradient magnetic field under the influence of the eddy current substantially agrees with the ideal waveform of the gradient magnetic field.

According to this embodiment, however, the waveform of the gradient magnetic field is transformed so as to cancel the eddy-current magnetic field, and therefore, the ideal waveform of the gradient magnetic field, such as that shown in FIG. 7(B), is obtained. This is because the value of the current supplied to the gradient magnetic field coil 26 is corrected to temporally vary according to the position of the imaging region and the time constant $\tau$ of the eddy-current magnetic field in this embodiment.

An imaging region Img1 in FIG. 3 is an example of an imaging region whose center coordinate is 10-cm away from the center of the magnetic field in the negative direction along the X axis (as with the coordinates (−10, 5, 2) described above). For example, in imaging of a shoulder or a wrist, the imaging region may be biased to the negative side in the X-axis direction, as with the imaging region Img1. In this case, the effect of the eddy-current magnetic field components can be substantially completely removed at the center of the imaging region Img1 by correcting the gradient magnetic fields Gx, Gy, and Gz so as to cancel the eddy-current magnetic field components with respect to the central position of the imaging region Img1. In a circumferential area of the imaging region Img1, the image quality is improved compared with the conventional technique that performs only the correction of the primary component, although the gradient magnetic fields cannot be completely corrected because the amplitude of each eddy-current magnetic field component differs from that at the center of the imaging region Img1.

Figure 8:
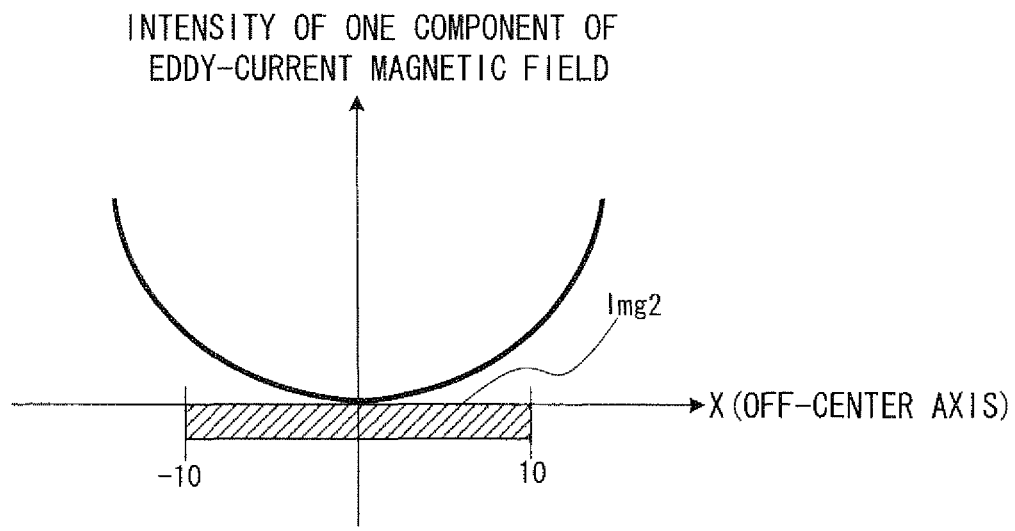
FIG. 8 is a schematic diagram similar to FIG. 3 showing an example of intensity distribution of another component of the magnetic field induced by the eddy current in the X-axis direction in the region 5-cm away from the center of the magnetic field in the positive direction along the Y axis.

FIG. 8 is a schematic diagram similar to FIG. 3 showing an example of intensity distribution of another component of the magnetic field induced by the eddy current in the X-axis direction in the region 5-cm away from the center of the magnetic field in the positive direction along the Y axis. The abscissa axis in FIG. 8 indicates the position in the X-axis direction. The longitudinal axis in FIG. 8 indicates the magnetic field intensity with the time constant $\tau$ of the secondary component of the Y component of the magnetic field induced by the eddy current. It is assumed that an imaging region Img2 shown as a shaded region in FIG. 8 is an imaging slab having a rectangular parallelepiped that extends from −10 cm to 10 cm in the X-axis direction, from −10 cm to 10 cm in the Y-axis direction, and from −0.5 cm to 0.5 cm in the Z-axis direction, for example. The center of the imaging region Img2 agrees with the origin of the apparatus coordinate system (the center of the magnetic field, in this example).

The amplitudes of the eddy-current magnetic field components can be determined from the average value in the imaging region. Taking the imaging region Img2 as an example, an example of process of averaging the deviations of the eddy-current magnetic field components in the X-axis direction and the Y-axis direction will be described.

For example, in the example shown in FIG. 4, the eddy-current magnetic field component XY_X includes only one term of a time constant of 50 milliseconds, and the amplitude $L_{XY\_X}$ can be calculated by substituting the X coordinate value of the imaging region Img2 for p in the formula (2). The X coordinate value is extracted at 21 measurement points in steps of 1 cm, such as −10, −9, . . . , 0, 1, . . . , 9, 10, to include the imaging region Img2 in the X-axis direction from one end to the other end. Then, the amplitude $L_{XY\_X}$ is calculated at each measurement point, and an average amplitude $AVL_{XY\_X}$ is calculated by averaging the calculated amplitudes over the measurement points. In the example shown in FIG. 4, since A1=0, A3=0, and A4=0, the average amplitude $AVL_{XY\_X}$ can be calculated according to the following formula (7).

$$AVL_{XY\_X} = \frac{1}{21} \times \sum_{p=-10}^{10} \{A1 \times p + A2 \times p^2 + A3 \times p^3 + A4 \times p^4\} \quad (7)$$

$$= \frac{1}{21} \times \sum_{p=-10}^{10} \{A2 \times p^2\}$$

$$= \frac{A2}{21} \times \{(-10)^2 + (-9)^2 \ldots + 10^2\}$$

$$\approx A2 \times 36.7$$

In the example shown in FIG. 5, the eddy-current magnetic field component XY_X includes only one term of a time constant of 100 milliseconds, and the amplitude $L_{XY\_Y}$ can be calculated by substituting the Y coordinate value of the imaging slice for p in the formula (1). As with the example described above, the Y coordinate value is extracted at 21 measurement points in steps of 1 cm, such as −10, −9, . . . , 10, to include the imaging region Img2 in the Y-axis direction from one end to the other end, the amplitude $L_{XY\_Y}$ is calculated at each measurement point, and the average amplitude $AVL_{XY\_Y}$ is calculated. In the example shown in FIG. 5, since A1=0, A3=0, and A4=0, the average amplitude $AVL_{XY\_Y}$ can be calculated according to the following formula (8).

$$AVL_{XY\_Y} = \frac{1}{21} \times \sum_{p=-10}^{10} \left[ \begin{array}{l} A1 + A2 \times \{pol(p)\} \times |p| + A3 \times \\ |p|^2 + A4 \times \{pol(p)\} \times |p|^3 \end{array} \right] \quad (8)$$

$$= \frac{1}{21} \times \sum_{p=-10}^{10} [A2 \times \{pol(p)\} \times |p|]$$

$$= \frac{A2}{21} \times \{(-1) \times |-10| + (-1) \times |-9| + \ldots + 1 \times |9| + 1 \times |10|\}$$

$$= A2 \times 0$$

The average amplitude of the other eddy-current magnetic field components can be calculated in the same way. In this way, the deviations of the gradient magnetic field distribution due to the eddy current can be averaged over the entire image.

In the case of multi-slice imaging, the correction of the gradient magnetic field distribution described above is preferably performed on an imaging-slice basis.

Figure 9:
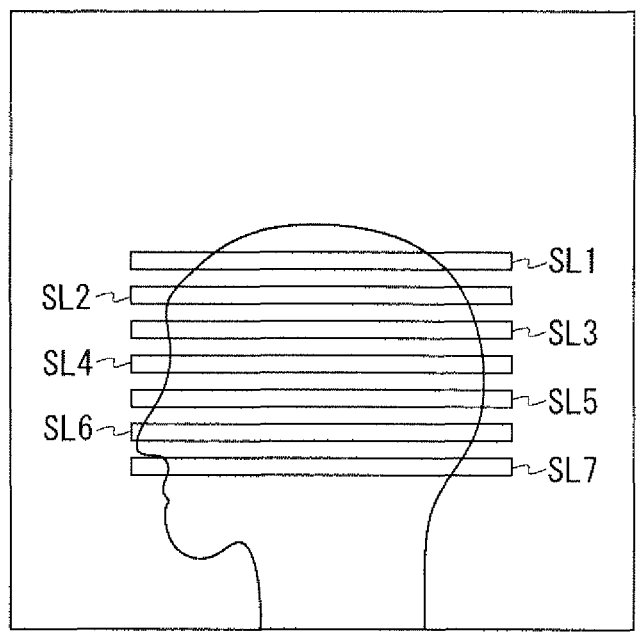
FIG. 9 is a schematic diagram showing an example of imaging slices in multi-slice imaging.

FIG. 9 is a schematic diagram showing an example of imaging slices in multi-slice imaging of a head. In multi-slice imaging, an imaging region is selected, and an MR signal is acquired from the imaging region. After that, during a waiting time until a repetition time (TR) for the imaging region is elapsed, another imaging region is selected by transmitting an RF pulse at a different frequency, and an MR signal is acquired from the another imaging region by applying an excitation pulse thereto. In this way, during one MR signal acquisition sequence, MR signals from a plurality of different imaging slices are acquired.

Figure 10:
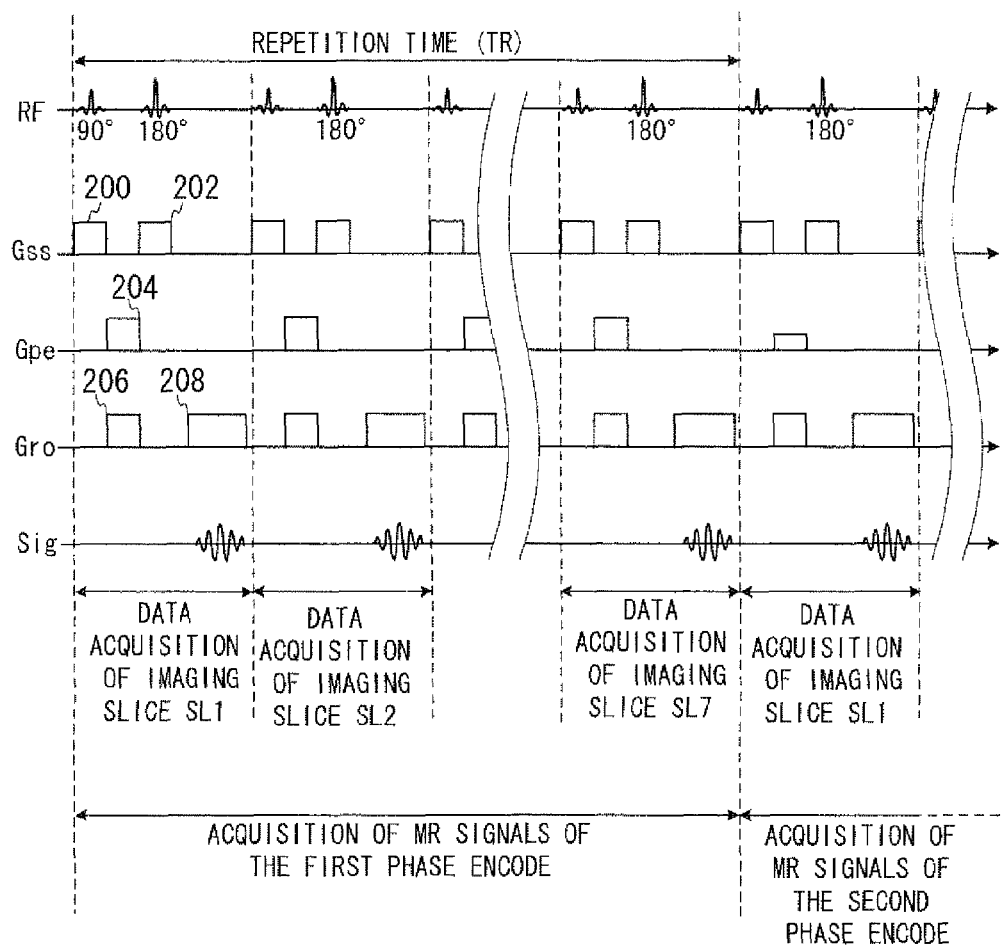
FIG. 10 is a schematic diagram showing an example of a pulse sequence according to the spin echo method in multi-slice imaging of imaging slices SL1 to SL7 in FIG. 9.

FIG. 10 is a schematic diagram for showing an example of a pulse sequence according to the spin echo method in multi-slice imaging of imaging slices SL1 to SL7 in FIG. 9. In FIG. 10, Gss represents a gradient magnetic field in the slice selection direction, Gpe represents a gradient magnetic field in the phase encoding direction, Gro represents a gradient magnetic field in the read-out direction, Sig represents a detected MR signal, and RF represents a 90° excitation pulse or a 180° refocusing pulse. In the example shown in FIGS. 9 and 10, the MR signals from the imaging slices SL1 to SL7 are acquired in one MR signal acquisition sequence.

Figure 11:
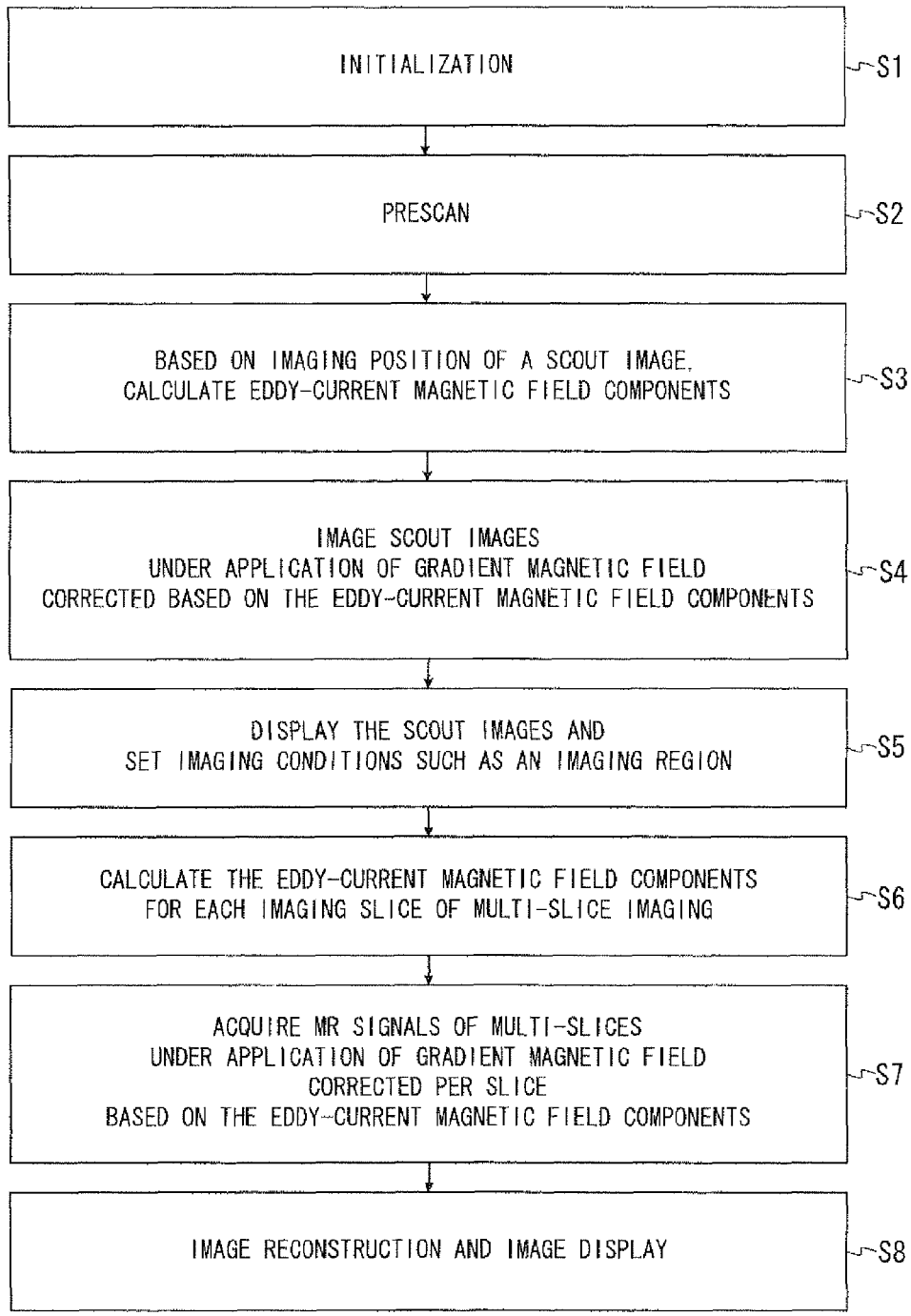
FIG. 11 is a flowchart illustrating a flow of a process performed by the MRI apparatus of the present embodiment.

FIG. 11 is a flowchart illustrating a flow of a process performed by the MRI apparatus 20 of the present invention.

In the following, taking the multi-slice imaging according to the spin echo method as an example, an operation of the MRI apparatus 20 including correction of the gradient magnetic field distribution will be described step by step with reference to FIG. 11 while referring also to FIGS. 1 to 10 described above as required.

[Step S1] An MPU 86 (see FIG. 2) performs initial setting of the MRI apparatus 20 based on input information or the like inputted to the operation device 60 via an input device 62. The input information includes information that prescribes at least part of imaging conditions. The imaging conditions include the flip angle, the repetition time, the number of slices, the imaging region (as positional information), the number of steps in the phase encoding direction and the frequency encoding direction, and the type of the pulse sequence, such as echo planar imaging (EPI) and spin echo, for example.

In this example, it is assumed that imaging conditions for multi-slice imaging are set in the initial setting.

[Step S2] The MRI apparatus 20 performs prescan to calculate the conditions for the imaging. For example, the MRI apparatus 20 calculates the power required to rotate a longitudinal magnetization component of a nuclear spin by 90° (90° condition) and the central frequency of the RF pulse.

[Step S3] The MPU 86 determines the imaging region of each scout image in an axial cross-section, a coronal cross-section, and a sagittal cross-section based on the input information or the like inputted in Step S1. The position acquiring unit 100 acquires the imaging region of each scout image as positional information in the imaging space from the MPU 86, and inputs the imaging region to the correction unit 102.

The positional information prescribes the center position of the imaging region and the three-dimensional range of the imaging region (the three-dimensional outer edge of the imaging region) in the apparatus coordinate system. For example, if the imaging region is an imaging slab having the shape of a rectangular parallelepiped having a certain thickness, the positional information may be the coordinates of the eight vertexes of the imaging region in the apparatus coordinate system. Alternatively, if the imaging region is an imaging slice, the positional information may be a set of the coordinates of the center of the slice, the thickness of the slice, the cross-sectional direction of the slice, and the longitudinal and lateral dimensions of the slice.

In this example, the correction unit 102 calculates the amplitudes of all the 27 eddy-current magnetic field components for each time constant with respect to the coordinates of the center of the imaging region of the scout image. These amplitudes are calculated according to the method described above by using the formulas (1) and (2) and the parameters A1 to A4 of the two formulas (see FIGS. 4 to 6) previously (preliminarily) stored in the correction unit 102. As described above with reference to the formulas (7) and (8), the amplitude of the eddy-current magnetic field component may be calculated as an average value over a plurality of coordinate positions between one end and the other end of the imaging region.

Then, the correction unit 102 calculates the value of the current supplied to the gradient magnetic field coil 26 that achieves the target (desired) gradient magnetic field distribution according to the method described above, and inputs the calculated value to the MPU 86. For example, the value of the current supplied to the gradient magnetic field coil 26 is a value that is corrected so as to provide a gradient magnetic field distribution obtained by subtracting all the eddy-current magnetic field components from the target magnetic field distribution.

[Step S4] The MPU 86 inputs an MR signal acquisition sequence for the scout images including the value of the current supplied to the gradient magnetic field coil 26 calculated as described above to the sequence controller 56. Then, the scout images are generated.

More specifically, the MPU 86 inputs imaging conditions including a pulse sequence into the sequence controller 56. Then, a static magnetic field is formed in the imaging space in the gantry by the static magnetic field magnet 22 excited by the static magnetic field power supply 40. In addition, electric current is supplied from the shim coil power supply 42 to the shim coil 24, thereby the static magnetic field formed in the imaging space is uniformed.

The sequence controller 56 drives a gradient magnetic field power supply 44, an RF transmitter 46, and an RF receiver 48 according to the inputted pulse sequence to produce a gradient magnetic field in the imaging region including an imaging target part of the object H and generate an RF signal from the RF coil 28. The values of the currents supplied to the X-axis gradient coil 26$x$, the Y-axis gradient coil 26$y$, and the Z-axis gradient coil 26$z$ have been corrected as described above. Therefore, as described above, depending on the position of the imaging region and the time constant of the eddy-current magnetic field, the waveform of the gradient magnetic field is modified so as to cancel the eddy-current magnetic field. That is, the target gradient magnetic field distribution is substantially achieved in the imaging region.

Then, MR signals generated by nuclear magnetic resonance inside the object H are received by the RF coil 28 and detected by the RF receiver 48. The RF receiver 48 performs predetermined signal processing on the detected MR signals and then performs A/D conversion the MR signals to generate raw data, which are digital data of the MR signals. The RF receiver 48 inputs the generated raw data to the sequence controller 56.

The sequence controller 56 inputs the raw data to the image reconstruction unit 90.

The image reconstruction unit 90 arranges the raw data in the k-space formed in the k-space database 92 as k-space data.

The image reconstruction unit 90 obtains the k-space data from the k-space database 92 and reconstructs image data by performing image reconstruction processing including Fourier transformation on the obtained k-space data. The image reconstruction unit 90 stores the reconstructed image data in the image database 94.

The image processing unit 96 obtains the image data from the image database 94 and generates image data for two-dimensional display by performing predetermined image processing on the obtained image data. The image processing unit 96 stores the image data for two-dimensional display in the storage device 66.

[Step S5] A display control unit 98 makes a display device 64 display the scout images on a monitor thereof according to an instruction from the MPU 86. Based on the displayed images, information required to set the imaging region or the like is inputted (by a user) to the operation device 60 via the input device 62.

Specifically, a rectangular frame that indicates the two-dimensional range of the imaging region on the scout image is inputted and set, for example. Alternatively, the thickness of the imaging region is inputted and set via the input device 62.

The MPU 86 acquires the conditions inputted in this step to calculate the three-dimensional range, and the three-dimensional position of the center, of a plurality of imaging slices in the apparatus coordinate system, and stores them as the positional information on the imaging slices in the imaging space. Note that the positional information described above is only an example, and the positional information calculated may be two-dimensionally. In the case where the imaging region is an imaging slice, as described above, the positional information may be a set of the coordinates of the center of the slice, the thickness of the slice, the cross-sectional direction of the slice, and the longitudinal and lateral dimensions of the slice.

In this example, the slices SL1 to SL7 shown in FIG. 9 are set as the imaging regions.

[Step S6] The position acquiring unit 100 acquires the positional information that prescribes the position and the three-dimensional range of each imaging slice from the MPU 86, and inputs the positional information to the correction unit 102.

The correction unit 102 calculates the amplitudes of the 27 eddy-current magnetic field components on an imaging slice basis in the same manner as in Step S3. The amplitude may be calculated with respect to the coordinates of the center of each imaging slice or calculated as an average value over the imaging slices according to the formulas (7) and (8) as described above. Then, the correction unit 102 calculates the value of the current supplied to the gradient magnetic field coil 26 that achieves the target gradient magnetic field distribution in the same manner as in Step S3, and inputs the calculated value to the MPU 86.

[Step S7] According to the sequence of multi-slice imaging set in Step S6 and the preceding steps, MR signals are acquired from the set imaging regions (the imaging slices SL1 to SL7, for example).

Specifically, the MPU 86 inputs the imaging conditions including the pulse sequence for multi-slice imaging to the sequence controller 56, and the static magnetic field is produced and uniformed as in the imaging of the scout images. The sequence controller 56 drives the gradient magnetic field power supply 44, the RF transmitter 46, and the RF receiver 48 according to the inputted pulse sequence to produce the gradient magnetic field in the imaging region and generate an RF signal from the RF coil 28.

Specifically, for example, in a first phase encoding MR signal acquisition, during the repetition time TR for the slice SL1, MR signals from the 7 imaging slices SL1 to SL7 are acquired (see FIG. 10). At this time, the correction values for the current supplied to the gradient magnetic field coil 26 have been calculated in Step S6 for each of the imaging slices SL1 to SL7, and therefore, the above-described correction of the gradient magnetic field is performed for each of the imaging slices SL1 to SL7, and MR signals are acquired from each imaging slice in the desired gradient magnetic field distribution. The gradient magnetic field includes the gradient magnetic field Gss in the slice selection direction, the gradient magnetic field Gpe in the phase encoding direction, and the gradient magnetic field Gro in the read-out direction.

Once the acquisition of MR signals in the first phase encoding is completed, the acquisition of MR signals in the second phase encoding is performed in the same way from the slice SL1 to the slice SL7. In this way, acquisition of MR signals is repeated as many times as the number of steps in the phase encoding direction while incrementing the phase encoding by one step at a time interval of the repetition time TR.

Then, as in the case of the scout images, raw data are generated from the MR signals received by the RF coil 28, and the raw data is placed as k-space data in a k-space produced by a k-space database 92.

[Step S8] The image reconstruction unit 90 obtains the k-space data from the k-space database 92 and reconstructs image data of all the imaging slices by performing image reconstruction processing including Fourier transformation on the obtained k-space data. The image reconstruction unit 90 stores the reconstructed image data in the image database 94.

The image processing unit 96 obtains the image data from the image database 94 and generates image data for two-dimensional display by performing predetermined image processing on the obtained image data. The image processing unit 96 stores the image data for two-dimensional display in the storage device 66.

The display control unit 98 makes the display device 64 display the image data for 2 dimensional display on the monitor thereof as an MR image according to an instruction from the MPU 86.

This is the end of the description of the operation of the MRI apparatus 20 according to this embodiment.

(Advantages of this Embodiment)

As described above, depending on (the position of) the imaging region, the amplitudes of the eddy-current magnetic field components are calculated for each time constant by taking into consideration not only the primary component but also the secondary and higher-order components. Then, the waveform of the gradient magnetic field is transformed by correcting the current supplied to the gradient magnetic field coil 26 so as to cancel the eddy-current magnetic field, and therefore, the target (desired) gradient magnetic field distribution can be substantially achieved. Thus, the image quality degradation due to the distortion of the gradient magnetic field distribution can be avoided.

In general, when the center of the imaging region agrees with the center of the magnetic field, the image quality degradation due to the distortion of the gradient magnetic field distribution is less significant. According to this embodiment, however, the current supplied to the gradient magnetic field coil 26 is corrected on an imaging slice basis, depending on the position of the imaging slice. Therefore, even if the imaging slice is away from the center of the magnetic field, the target (desired) gradient magnetic field distribution can be substantially achieved, and therefore, the image quality degradation due to the distortion of the gradient magnetic field distribution can be avoided.

In the multi-slice imaging, calculation of the amplitudes of the eddy-current magnetic field components for each time constant and correction of the current supplied to the gradient magnetic field coil 26 based on the result of the calculation are performed for each imaging slice, based on the position of each imaging slice. As a result, in the multi-slice imaging, MR signals can also be acquired from each imaging slice in the desired gradient magnetic field distribution, and the image quality degradation can be avoided.

In short, according to the embodiment described above, the magnetic field components induced by the eddy current in MRI can be easily compensated for to improve the image quality.

Figure 12:
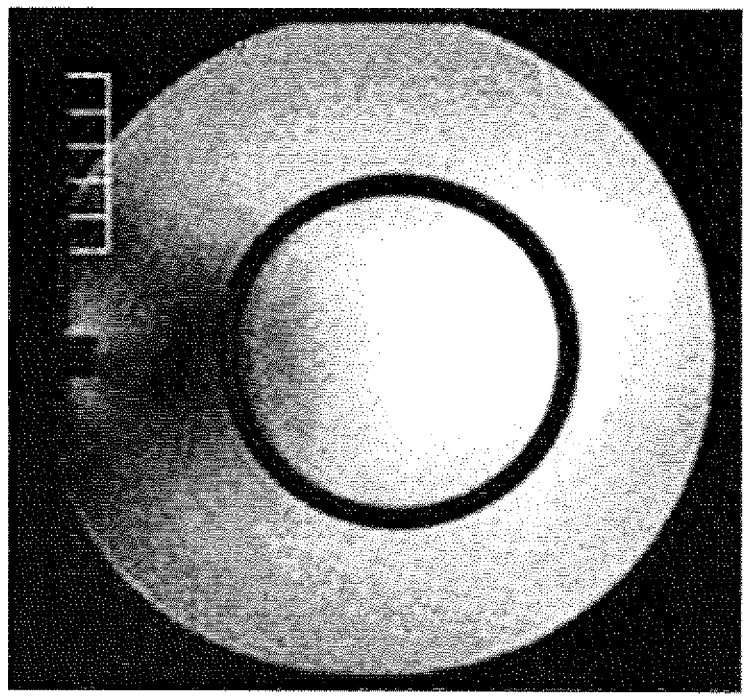
FIG. 12 is an example of an image of a phantom taken without performing the correction of the gradient magnetic field based on the eddy-current magnetic field components.

FIG. 12 shows an example of a sagittal cross-sectional image of a phantom taken without performing the correction of the gradient magnetic field based on the eddy-current magnetic field components. This phantom is substantially elliptical and has a ring-shaped low signal region (a region contains little hydrogen atoms) at the center thereof.

Figure 13:
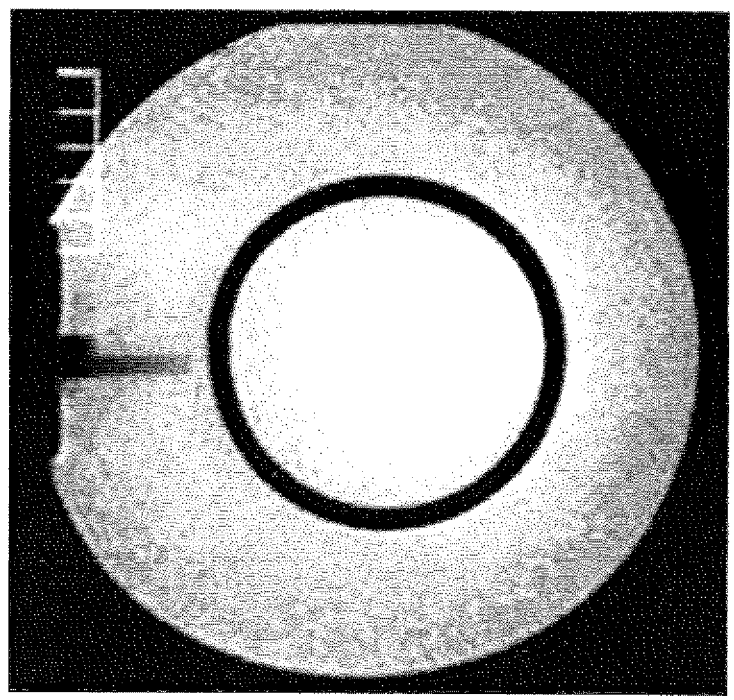
FIG. 13 is an example of an image of the same phantom as in FIG. 12 taken by performing the correction of the gradient magnetic field distribution according to the method according to this embodiment.

FIG. 13 shows an example of a sagittal cross-sectional image of the same phantom as in FIG. 12 taken by performing the correction of the gradient magnetic field distribution according to the method of the present embodiment. Both the images shown in FIGS. 12 and 13 are taken at an X off-center position according to the fast spin echo (FSE) method. The horizontal direction in the image is the Y-axis direction. In FIG. 12, the darkened region extending leftward from the center of the image across the black ring-shaped region is the part degraded in image quality. This region is caused by the sensitivity unevenness due to the Carr-purcell Meiboom-Gill sequence (CPMG) condition in the FSE method. Referring to the region to the left of the center of the image in FIG. 13, it can be seen that the part of the image in FIG. 12 that is degraded in image quality is clear in FIG. 13.

(Supplementary Notes of this Embodiment)

[1] In the embodiment described above, the amplitudes of the eddy current-induced magnetic field components are calculated using the formulas (1) and (2) and the tables shown in FIGS. 4 to 6 by taking into consideration the primary to fourth components, as an example. However, embodiments of the present invention are not limited to such an implementation. The formulas (1) and (2) and the tables shown in FIGS. 4 to 6 are only examples of the method of calculating the amplitude of the eddy-current magnetic field component, and other calculation methods can also be used. According to an alternative calculation method, fifth and higher order components may be taken into consideration.

In addition, although the center of the magnetic field has been described as being located at the origin of the apparatus coordinate system, this is also an example. The method according to this embodiment can be applied even if the center of the magnetic field does not agree with the origin of the apparatus coordinate system.

[2] An operation of the MRI apparatus 20 including the correction of the gradient magnetic field distribution has been described with reference to FIGS. 9 to 11, by taking the multi-slice imaging according to the spin echo method as an example. However, embodiments of the present invention are not limited to such an implementation. The MR signal acquisition sequence may be designed for multi-slice imaging according to other methods, such as the field echo method. Alternatively, other imaging sequences designed not for multi-slice imaging but for oblique imaging may be used.

[3] An example has been described in which (as the MRI apparatus 20) the RF receiver 48 is disposed outside the gantry that includes the static magnetic field magnet 22, the shim coil 24, the gradient magnetic field coil unit 26, the RF coils 28 and the like (see FIG. 1). However, the embodiment of the present invention is not limited to such an implementation. The RF receiver 48 may be included in the gantry.

Specifically, for example, an electronic circuit board that is equivalent to the RF receiver 48 may be disposed in the gantry. Then, the MR signal, which is an analog electrical signal converted from the electromagnetic wave by the receiving RF coil 28, may be amplified by a pre-amplifier in the electronic circuit board, the amplified signal may be outputted to the outside of the gantry as a digital signal and inputted to the sequence controller 56. In outputting the signal to the outside of the gantry, for example, an optical communication cable is preferably used to transmit the signal in the form of an optical digital signal. This is because the effect of external noise is reduced.

[4] Correspondences between terms used in the claims and terms used in the embodiment described above will be described. Note that the correspondences described below are just some of possible interpretations for reference and should not be construed as limiting the present invention.

The functions of the entire structure including static magnetic field magnet 22, the shim coil 24, the gradient coil 26, the RF coils 28 and the control device 30 (see FIG. 1) that receive MR signals from the object H under imaging with application of gradient magnetic fields and RF pulses are an example of a signal acquisition unit described in the claims.

The functions of the image reconstruction unit 90, image database 94 and image processing unit 96 (see FIG. 2) that generate image data of the object P based on the acquired MR signals are an example of an image generating unit described in the claims.

[5] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
gradient magnetic field coils, a static magnetic field generator, at least one radio frequency (RF) coil, at least one RF transmitter and at least one RF receiver, said components being coupled to an MRI control system configured to:
acquire a magnetic resonance signal produced from an object by applying a gradient magnetic field and an RF pulse in an imaging space where the object is placed;
reconstruct image data on the object based on the magnetic resonance signal;
acquire an imaging region as positional information in the imaging space; and
adjust a distribution of the gradient magnetic field to approximate a target distribution by transforming a waveform of the gradient magnetic field based on the positional information and a time constant of an eddy-current magnetic field to cancel at least part of the eddy-current magnetic field, the eddy-current magnetic field being induced by an eddy current caused by application of the gradient magnetic field,
wherein the MRI control system is further configured
(a) to calculate, for each direction of application of the gradient magnetic field, an amplitude of a component of the eddy-current magnetic field in an X-axis direction of an apparatus coordinate system, an amplitude of a component of the eddy-current magnetic field in a Y-axis direction of the apparatus coordinate system, and an amplitude of a component of the eddy-current magnetic field in a Z-axis direction of the apparatus coordinate system based on a distance between the imaging region and a magnetic field center obtained from the positional information, and
(b) to adjust the distribution of the gradient magnetic field to more closely approximate the target distribution by temporally varying a value of the current supplied to the gradient magnetic field coil according to the time constant of the eddy-current magnetic field and a result of the calculations.

2. The magnetic resonance imaging apparatus according to claim 1, wherein:
wherein the MRI control system is also configured to preliminarily store the time constant of the eddy-current magnetic field as a value based on a relative positional relationship between the gradient magnetic field coils and the static magnetic field magnet and a shape and material of the gradient magnetic field coils, and to transform the waveform of the gradient magnetic field according to the time constant.

3. The magnetic resonance imaging apparatus according to claim 1, wherein:
the MRI control system is also configured to acquire a center position of the imaging region based on the positional information, and to perform the calculations based on a distance between the center position and the magnetic field center.

4. The magnetic resonance imaging apparatus according to claim 3, wherein:
the MRI control system is also configured to adjust the distribution of the gradient magnetic field closer to the target distribution by temporally varying a value of the current supplied to the gradient magnetic field coil according to the time constant of the eddy-current magnetic field.

5. The magnetic resonance imaging apparatus according to claim 3, wherein:
the MRI control system is also configured:
to acquire the magnetic resonance signal from a plurality of imaging regions corresponding to a plurality of images respectively;
to acquire the plurality of imaging regions as a plural sets of positional information; and
to correct the current supplied to the gradient magnetic field coil for each of the imaging regions.

6. The magnetic resonance imaging apparatus according to claim 1, wherein:
the MRI control system is also configured to perform the calculations so as to calculate amplitudes of components of the eddy-current magnetic fields in an X-axis direction, a Y-axis direction and a Z-axis direction in an apparatus coordinate system as average values over a width of the imaging region by using respective distances from the magnetic field center to a plurality of positions in the imaging region.

7. The magnetic resonance imaging apparatus according to claim 6, wherein:
the MRI control system is also configured:
to acquire the magnetic resonance signal from a plurality of imaging regions corresponding to a plurality of images respectively;
to acquire the plurality of imaging regions as a plural sets of positional information; and
to correct the current supplied to the gradient magnetic field coil for each of the imaging regions.

8. The magnetic resonance imaging apparatus according to claim 1, wherein:
the MRI control system is also configured:
to acquire the magnetic resonance signal from a plurality of imaging regions corresponding to a plurality of images respectively;
to acquire the plurality of imaging regions as plural sets of positional information; and
to correct the current supplied to the gradient magnetic field coil for each of the imaging regions.

9. The magnetic resonance imaging apparatus according to claim 1, wherein:
the MRI control system is configured:
to perform, as multi-slice imaging, acquisition of a magnetic resonance signal from an imaging region by applying a gradient magnetic field and an RF pulse that selectively excite the imaging region and acquisition of a magnetic resonance signal from another imaging region by applying a gradient magnetic field and a RF pulse that selectively excite the another imaging region during a period until a repetition time for the imaging region is elapsed;
to acquire positional information on each of imaging regions selectively excited in the multi-slice imaging; and
to perform calculation of amplitudes of components of the eddy-current magnetic fields in an X-axis direction, a Y-axis direction and a Z-axis direction in an apparatus coordinate system for each of the imaging regions, and to correct current supplied to the gradient magnetic field coil for each of the imaging regions based on a result of the calculation.

10. The magnetic resonance imaging apparatus according to claim 1, wherein:
the positional information is information that prescribes a three-dimensional range of the imaging region.

11. The magnetic resonance imaging apparatus according to claim 1, wherein:
the positional information is a coordinate position of each vertex of an outer edge of the imaging region in an apparatus coordinate system.

12. The magnetic resonance imaging apparatus according to claim 1, wherein:
the positional information is a set of information including a coordinate of a center of the imaging region, a thickness of a slice, a cross-sectional direction of the slice, and longitudinal and lateral dimensions of the slice.

13. A control device for a magnetic resonance imaging (MRI) apparatus,
the magnetic resonance imaging apparatus being configured to (i) supply a current to at least one gradient magnetic field coil to generate a gradient magnetic field to an imaging space where an object is placed, and (ii) perform magnetic resonance imaging of the object by using the gradient magnetic field,
the control device including at least one MRI control processor configured to:
acquire an imaging region of the magnetic resonance imaging apparatus, as positional information in the imaging space; and
adjust a distribution of the gradient magnetic field to more closely approximate a target distribution by transforming a waveform of the gradient magnetic field based on the positional information and a time constant of an eddy-current magnetic field to at least partly cancel the eddy-current magnetic field, the eddy-current magnetic field being induced by an eddy current caused by application of the gradient magnetic field,
wherein said at least one MRI control processor is configured
(a) to calculate, for each direction of application of the gradient magnetic field, an amplitude of a component of the eddy-current magnetic field in an X-axis direction of an apparatus coordinate system, an amplitude of a component of the eddy-current magnetic field in a Y-axis direction of the apparatus coordinate system, and an amplitude of a component of the eddy-current magnetic field in a Z-axis direction of the apparatus coordinate system based on a distance between the imaging region and a magnetic field center obtained from the positional information, and
(b) to adjust the distribution of the gradient magnetic field to more closely approximate the target distribution by temporally varying a value of the current supplied to the gradient magnetic field coil according to the time constant of the eddy-current magnetic field and a result of the calculations.

14. A magnetic resonance imaging (MRI) method comprising:
acquiring an imaging region as positional information in an MR imaging space where an object is placed;
adjusting, as a correction step, a distribution of a gradient magnetic field to more closely approximate a target distribution by transforming a waveform of the gradient magnetic field based on the positional information and a time constant of an eddy-current magnetic field to at least partly cancel the eddy-current magnetic field, the eddy-current magnetic field being induced by an eddy current caused by application of the gradient magnetic field;
acquiring a magnetic resonance signal produced from the object by applying the gradient magnetic field transformed in the correction step and an RF pulse in the imaging space; and
reconstructing image data on the object based on the magnetic resonance signal,
wherein said correction step comprises
(a) calculating, for each direction of application of the gradient magnetic field, an amplitude of a component of the eddy-current magnetic field in an X-axis direction of an apparatus coordinate system, an amplitude of a component of the eddy-current magnetic field in a Y-axis direction of the apparatus coordinate system, and an amplitude of a component of the eddy-current magnetic field in a Z-axis direction of the apparatus coordinate system based on a distance between the imaging region and a magnetic field center obtained from the positional information, and
(b) adjusting the distribution of the gradient magnetic field to more closely approximate the target distribution by temporally varying a value of the current supplied to the gradient magnetic field coil according to the time constant of the eddy-current magnetic field and a result of the calculations.

* * * * *